United States Patent
Malygin et al.

(10) Patent No.: US 10,310,995 B1
(45) Date of Patent: Jun. 4, 2019

(54) ARBITRATION CONTROL SYSTEM AND METHOD FOR STORAGE SYSTEMS

(71) Applicant: YADRO INTERNATIONAL LTD, Nicosia (CY)

(72) Inventors: Mikhail Malygin, St. Petersburg (RU); Maxim Trusov, St. Petersburg (RU); Nikita Gutsalov, St. Petersburg (RU); Ivan Andreyev, St. Petersburg (RU); Ivan Tchoub, St. Petersburg (RU); Alexey Sigaev, Moscow (RU); Artem Ikoev, Moscow (RU)

(73) Assignee: YADRO INTERNATIONAL LTD, Nicosia (CY)

( * ) Notice: Subject to any disclaimer, the term of this patent is extended or adjusted under 35 U.S.C. 154(b) by 0 days.

(21) Appl. No.: 16/051,950

(22) Filed: Aug. 1, 2018

(51) Int. Cl.
| | |
|---|---|
| *G06F 1/26* | (2006.01) |
| *G11C 5/14* | (2006.01) |
| *G06F 13/16* | (2006.01) |
| *G06F 13/42* | (2006.01) |
| *G06F 13/362* | (2006.01) |
| *G06F 12/0806* | (2016.01) |
| *G06F 12/0868* | (2016.01) |

(52) U.S. Cl.
CPC .......... *G06F 13/1605* (2013.01); *G06F 1/263* (2013.01); *G06F 12/0806* (2013.01); *G06F 12/0868* (2013.01); *G06F 13/362* (2013.01); *G06F 13/4221* (2013.01); *G11C 5/141* (2013.01); *G06F 2212/401* (2013.01); *G06F 2212/402* (2013.01); *G06F 2213/0026* (2013.01)

(58) Field of Classification Search
CPC . G06F 1/263; G06F 1/30; G06F 12/08; G06F 12/0802; G06F 12/0806; G06F 12/0868; G06F 12/084; G06F 12/0842; G06F 12/0844; G06F 13/1605; G06F 13/362; G06F 13/4221; G06F 2213/0026; G06F 2212/401; G06F 2212/402; G11C 5/141
See application file for complete search history.

(56) References Cited

U.S. PATENT DOCUMENTS

2016/0308968 A1   10/2016   Friedman

*Primary Examiner* — Thomas J Cleary
(74) *Attorney, Agent, or Firm* — Cantor Colburn LLP

(57) ABSTRACT

A data storage system, including a host server having storage processors, a PCIe fabric, and a GBE fabric, and two or more data storage modules having a bank of DRAM, long-term storage drives, a host interface, including a PCIe interface and a GBE interface, an application specific integrated circuit connected to the host interface, the storage drives, and the DRAM, and a battery, the battery providing power to the DRAM and SSDs in an event of failure of a main power supply. Data streams transmitted from the host server via a PCIe connection of the PCIe fabric are received at the host interface and placed directly in DRAM as a write-back cache operation. In addition, the battery provides the DRAM with non-volatile memory capabilities and the storage modules with portability. A method for arbitration of write requests between the storage processors of the data storage system is also disclosed.

15 Claims, 5 Drawing Sheets

ARBITRATION CONTROL SYSTEM AND METHOD FOR STORAGE SYSTEMS

FIELD OF THE INVENTION

The invention relates to a distributed data management system that arbitrates the placement of data on networked storage modules and processes data sent into the system using internal active-active controllers.

BACKGROUND OF THE INVENTION

Only recently has dynamic random-access memory (DRAM) become dense enough to be used for large data storage solutions. In addition, the volatility of DRAM has been reduced so that persistent random-access memory is readily available. These developments have resulted in solid-state drives (SSDs) being increasingly available and affordable as a storage solution to replace hard drives and optical drives.

Solid state drives contain non-volatile memory which can be read and written quickly since they do not require the seek time of traditional optical and magnetic drives. However, to obtain the full benefit of these faster data placement speeds, quicker bus connections are needed besides traditional SATA and SCSI connections. Thus, simple interface adapters have been created to connect the PCI Express ports of computers to solid state drives to increase the throughput.

Because SSDs have high throughput and faster read/write than other drives, they can be used both as auxiliary memory (RAM) for the CPU and for long-term storage replacing hard drives. These non-volatile memory express (NVMe) solutions are primarily for enhancing personal computers for gaming and data processing. NVMe connects to flash memory based SSDs via PCI Express. It was standardized around 2008 but did not reach consumer devices until later in 2013.

However, NVMe coupled with flash SSDs provides only a partial solution to hybrid storage. Specifically, the interface only provides a link between faster memory and generic computers or servers. The solution provides no stand alone benefits or capabilities besides the elimination of the bottleneck between CPU and SSD created by traditional bus interfaces.

For example, the NVRAM storage solution disclosed in US 2016/0308968 by Alex Friedman provides NVRAM cache as an intermediary between a host and long-term storage. This disclosure provides Redundant Array of Inexpensive Disks (RAID) segmentation on top of the SSDs and allows transfer of stripes of the RAID array to HDD storage. Thus, its use of SSD cache for the storage volume allows faster placement of data than traditional HDD storage, but provides no control, processing, or automation at the storage level. Rather Friedman's device relies on control servers separate from the host for all these decisions. Thus, the device is merely a variation on traditional storage solutions with faster SSD storage replacing a part of HDD storage.

Increasingly however, cloud computing solutions require smarter and more capable storage solutions. Just as super computers now combine massively parallel arrays of CPUs, GPUs, and/or ASICs into smart blocks with reconfigurable interconnects and distributed intelligence, a similar solution is needed for the storage side of a server. CPU arrays require additional memory besides that dedicated to their processing capabilities; likewise, GPUs and ASICs normally have little memory besides cache to handle the data awaiting processing.

Storage arrays have previously been developed for long-term storage of archive data, system back ups, and large data sets. Indeed many are so long term that the storage arrays often utilize automated tape drive storage to store the little-used data. Clearly seek times, bus bottlenecks, and data placement speeds are not of concern in these solutions.

Large data systems are usually composed of different variations of these storage arrays, called storage modules. These storage modules are managed in two ways: active-passive and active-active. Active-passive storage controllers are the most common implementation type for data storage. In this configuration, two (or more) controllers are installed in the storage array but the storage volumes are assigned to one controller. The second controller has access to the volumes, but is used only as a back-up if the first controller fails. If and when the first storage controller fails, the second controller seamlessly intervenes so that data access continues. An alternative to active-passive controllers is active-active controllers. With the active-active approach, all controllers are available to support all storage volumes and volumes are not assigned to any particular storage controller. If a controller fails, the surviving controllers can support the additional volumes from the failed controller.

The number of storage volumes or logically addressed partitions or logical unit numbers (LUNs) is usually quite large in a data management system. LUNs can cross server boundaries, hard drive boundaries, RAID boundaries, or re-divide those boundaries up in other ways. These LUNs need management, redundancy, and protection which are usually provided by a cluster management system. This management system will provision the LUNs and provide storage-area network (SAN) zoning and masking for the LUNs.

In addition, the storage processors manage the data placement and control on the various LUNs and/or storage modules via a Fibre Channel Protocol (FCP), iSCSI or the NVMe protocol, or both. The FCP/NVMe fabrics of physical interconnects carry SCSI commands to the LUNs over fiber, gigabyte Ethernet (GBE), or PCIe networks. The NVMe fabric additionally connects with SSD hard drive arrays via host bus adapters (HBAs).

Most storage management systems have several storage modules or several storage processors. Increasingly, the problem has become one of arbitration between different storage processors within the same active-active or active-passive cluster. Different application hosts access the storage cluster requesting download of data, processing of data, or storage of data. All these requests need arbitration between the storage processors and processing timeline monitoring. For example, if write and read requests are directed to the same data block by different storage processors within a short period of time, the read request will try to return data from the write request of the other storage processor even if it has not been placed yet.

Large data sets increasingly need to be available en masse for quick accessibility as various segments are compared, searched, merged, or sorted. Therefore, the volume of requests is exponentially increasing. Likewise, the size of the storage systems within a single cluster is increasing. As a result, large numbers of storage processors need continuous management and arbitration.

SUMMARY OF THE INVENTION

The invention provides a modularized hardware box with on-board processing and data control alongside large scale, battery-supported RAM storage backed up by NAND persistence. In addition, the invention provides several abstraction layers and network hubs which aggregate the modules into a massively parallel data array for centralized control via a host. Importantly this smart data solution can provide several layers over the storage medium allowing redundancy, flexibility, and broader support of hosts. The independently managed data modules beneath the software abstraction layer provide powered DRAM for faster read/write and fully functionality as either auxiliary RAM or rapid-access long term storage.

The smart RAM module having a bank of dynamic random access memory (DRAM); NAND flash memory modules; a host interface, several Peripheral Component Interconnect Express (PCIe) interfaces; an application specific integrated circuit (ASIC) connected to a host interface; and a battery, the battery providing power to the DRAM, NAND flash and the ASIC in an event of failure of a main power supply. The battery is powerful enough to allow the ASIC to back up DRAM contents onto NAND flash for persistence without power. The ASIC provides the DRAM as persistent storage via the PCIe interface to the storage processors, and the power provided by the battery and the main power supply makes the DRAM non-volatile and allows the smart NVRAM module to be fault-tolerant.

The ASIC receives, processes, stores, and distributes a data stream from the storage processor via the PCIe interface. The data stream being sequentially hashed during receipt such that, upon completion of the receipt of data from the data stream, a confirmation is immediately sent. The ASIC has its own cache, a memory controller, a power manager, and a CPU. The ASIC executes applications, encrypts data, compresses data, hashes data in real time, and conducts data analysis such as sorting, comparing, merging, and searches as internal processes. Intermediate metadata and final metadata generated by the internal processes is stored on the DRAM for quicker processing on the smart NVRAM module itself.

The smart NVRAM module is connected to at least one other smart NVRAM modules via a PCIe fabric. The other smart NVRAM modules serve as mirrors for the main one and take over in case of a hardware failure on the main smart NVRAM module. The smart RAM module is portable, and swappable, and retains data stored in the DRAM while being swapped and/or transported.

A data storage system is provided having storage processors, a PCIe fabric, and a GBE fabric; and smart NVRAM modules. A data stream transmitted from the storage processors via a PCIe connection of the PCIe fabric is received at the host interface of the ASIC on the smart NVRAM module and placed directly in DRAM.

The smart NVRAM module with this placement capability can be used as persistent fault-tolerant memory for the storage processors. In this scenario, the smart NVRAM modules support the operation of the storage processors as write-back cache. Additionally, the smart NVRAM modules can work as an arbitration controller for the storage processors. In this case, the smart NVRAM modules ensure the atomicity of operations, specifically, reads and writes, amongst the storage processors. Additionally, the smart NVRAM module can perform as a write-ahead log where data requests are stored in the module and then retrieved by the storage processors when they are able to be processed.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
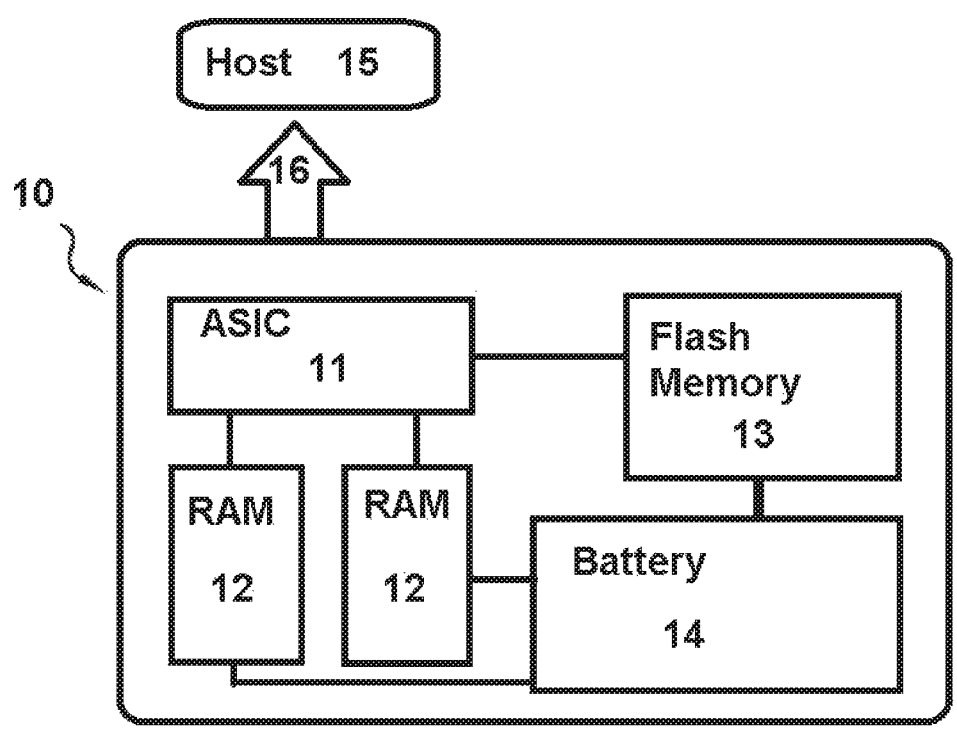
FIG. 1 shows a schematic of the storage module with internal components.

The smart RAM module 10 shown in FIG. 1 shows an exemplary smart NVRAM module containing an application specific integrated circuit (ASIC) or system-on-a-chip (SOC) 11 connected to DRAM memory banks 12 and NAND flash memory or SSDs 13 as well as the storage processor 15. The connection 16 with the storage processor 15 is preferably via Peripheral Component Interconnect (PCI) Express. The buses to the RAM 12 and the NAND flash 13 preferably are also high speed interfaces.

The RAM 12 requires constant power in order to function as persistent memory. Though the smart NVRAM module 10 has a primary, wired power source (not shown), a back up battery 14 has been provided to maintain power to the RAM 12, the ASIC 11, and NAND flash 13 at all times.

The RAM 12 acts as cache for the smart NVRAM module 10 with data received over the PCI Express connection 16 being immediately, and preferably automatically, placed in the RAM 12. These banks of RAM 12 include at least 128 gigabytes of DDRx (preferably DDR4) memory each, with the smart NVRAM module 10 having at least two banks of RAM 12.

Additionally, the SSDs can be supplemented or replaced with HDDs for long term storage. Once data from the storage processor 15 has been placed on the cache/RAM 12, the ASIC 11 can allocate the received data to NAND flash 13 storage if the smart NVRAM module is filling up or if the write request data is not a high priority. The RAM 12 can behave as auxiliary cache for storage processors, and therefore, requires instant placement speeds matching those of on-board cache (e.g. 100 Gbps).

The smart NVRAM module 10 preferably has a U.2 form factor for use in data centers. The on-board ASIC 11 manages control and communication with the storage processor 15 and other smart NVRAM modules 10 via the PCI Express bus. The PCI Express connection is preferably a 3rd generation, 4 lane interface for increased throughput. The storage processor 15 then decides how the smart NVRAM module 10 is to be treated, whether as cache for processes, or for independent data processing exported to the smart RAM module 10, or for arbitration of read/write instructions between storage processors 15.

The on-board ASIC 11 is capable of a number of functions including executing applications, encrypting data, compression, hashing data in real time, and data analysis such as sorting, comparing, merging, and searching data. Therefore, the any data processing can be done by the system in close proximity to the data with specialized architecture to perform data analysis faster than traditional server processors and SSD configurations. The ASIC 11 can also assist the data processing of the storage processors 15, reducing their CPU load.

The ASIC 11 is also provided with its own supporting cache, memory controller, RAID controller, power management, and CPU. These are used for processing data in real time, such as hashing data sequentially as it is received so that the error-free receipt can be confirmed immediately upon completion of the transmission. The ASIC 11 also supports data virtualization and networking functions such as progressive packet parsing, traffic management, deep packet inspection, and elastic packet buffering. In addition to the PCI Express interface 16, the ASIC 11 is provided with a gigabyte Ethernet (GBE) interface for less-data intensive communications with the network.

In particular, the smart NVRAM module 10 can perform as a write-back cache or a write-ahead log for the storage processors. Write-back cache is performed by storage processors writing directly to cache (here RAM 12) and confirming completion of the transfer immediately when the ASIC 11 acknowledges the caching operation is complete. This mode provides low latency and high throughput for write-intensive applications. In addition, the data written immediately out to the RAM 12 is available immediately and has the resilience and persistence of NAND flash memory since it is independently powered. This solves many of the traditional challenges with write-back cache solutions.

Upon initiation of receiving data from the host 15, the ASIC 11 allocates a dedicated memory region in RAM 12 to the incoming data and, if required, can begin calculating a sequential hash of the data, or other processing that is also stored in the dedicated memory region. Any additional application specific metadata accompanying the data when transmitted is also stored in the dedicated memory region. Furthermore, any metadata generated by the ASIC 11 when processing the stored data is also placed in the dedicated memory region accessible as the storage processor's CPU address space so that the storage processors can treat the smart RAM module 10 as their own local memory.

In contrast, traditional task allocation results in split data placement with metadata and data intermediates being stored in local cache near the server processors while other metadata and core data is stored remotely in specialized storage solutions. This results in processing delay and excessive bus or network traffic. In addition, the local cache of a processor is limited and any overflow or limit requires transfer of that data over to the remote storage before processing can continue.

In addition to sequential hash calculation and verification and data processing, the ASIC 11 can implement in-memory key value structures (e.g. b-trees) and a storage system specialized for key value storage interfacing ensuring the atomicity of operations. These data structures store data using associative arrays, relation tables, or hashes to identify or match data values with keys. Thus, the smart NVRAM module 10 supports data processing in relational databases, non-relational databases, and graph databases and storage of key values internally without outside data management. Advantageously, the metadata for the stored data is stored along with the write data and write requests.

Traditionally, the data stream from application host to final storage is as follows. First the storage processor receives the application data stream from the network and stores it in the storage processor memory (RAM). The data pages are then stored in a write-back cache memory (usually SSDs/NVMe) and the storage processor confirms to the application host that the write is complete. The data is then processed and moved to the final media (usually HDDs) and the hash is stored in a transaction log elsewhere.

The smart NVRAM module 10 receives data from the PCIe network and stores it in RAM 12. Since the RAM 12 is persistent, not as limited as the RAM at the storage processors, the smart NVRAM module does not need to move the data immediately. Therefore, the data transmission from the host application to the final media is completed in one exchange with the confirmation receipt being sent immediately since the data transmission is hashed sequentially.

Figure 2:
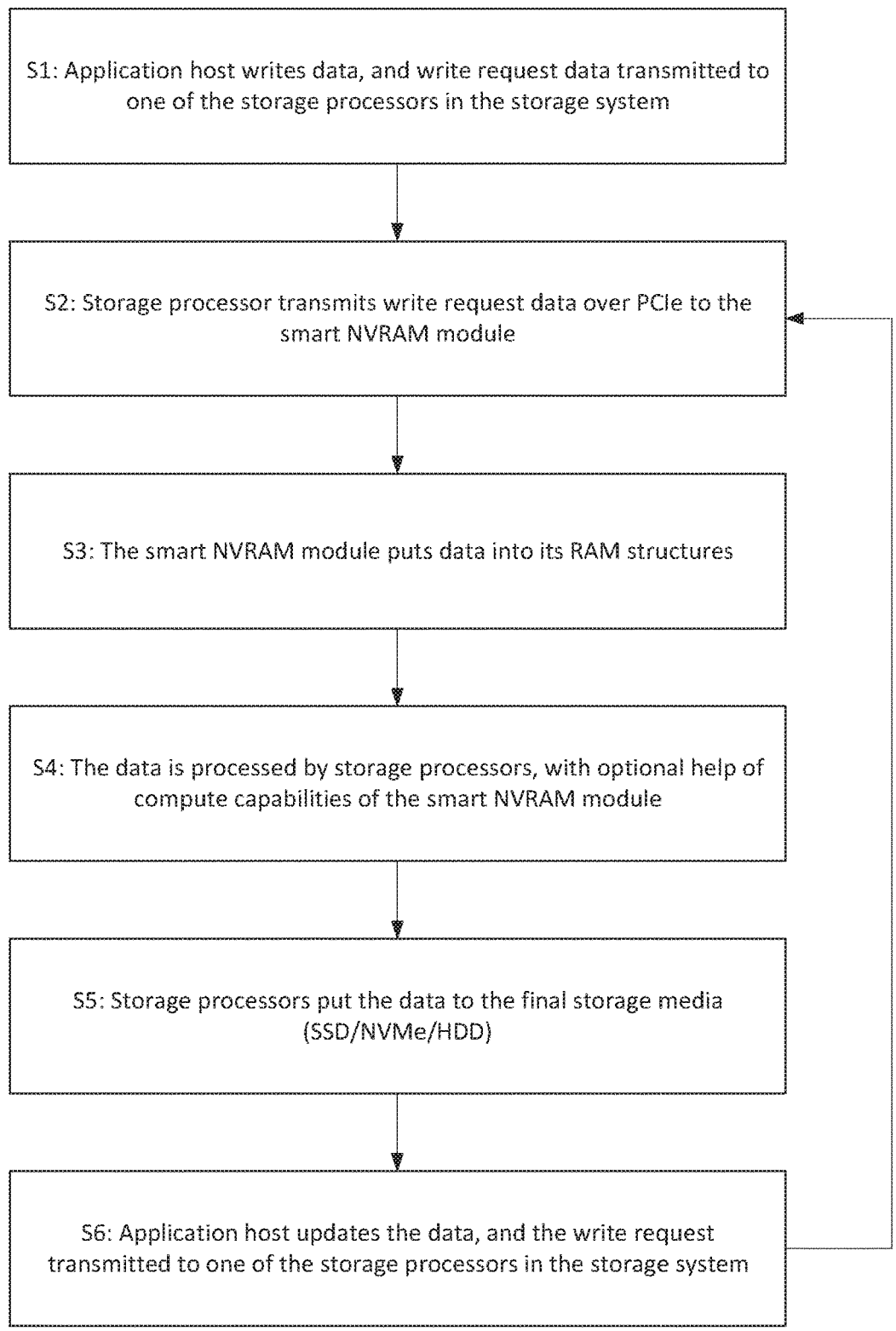
FIG. 2 shows a series of steps by which data is transferred from the host application to the storage cluster.

Specifically, the transmission steps beginning with the application host request and ending with final placement are shown in FIG. 2 as a sequential method. First, in step 1 (S1) an application on the application server can push data out to the storage management system. Additionally, a user interface connected to a software abstraction interface for storage or data analysis. The data push request transmitting data to one of the storage processors in the storage management system.

Next in step 2 (S2), the write request is forwarded from the storage processor to the smart NVRAM modules 10. The entire transmission from receipt at the storage processor through the several abstraction layers to the smart NVRAM module 10 is preferably conducted via PCIe fabric. Control signals for the software layers may be transmitted through a separate GBE fabric.

Then in step 3 (S3), the data is received at the PCIe interface on the smart NVRAM module 10 and immediately placed in RAM 12 in a dedicated memory region. Hashing or processing of the data is also initiated and placed in the dedicated memory region. Once the data has been completely received and/or the sequential hash matches the application host hash, the ASIC 11 transmits the confirmation to the storage processor.

Once the data is placed on the RAM 12, the storage system or storage processors begin, in step 4 (S4), processing the data using the processing of the ASIC in S3. The ASIC 11 can accept code exported by the application for remote execution, or if the data analysis is routine (e.g. a sort or search) the ASIC 11 can perform the functions internally. Therefore, the processing can be performed entirely on the smart RAM module 10 and completion is simply communicated to the host application.

After all data processing in the storage management system is completed, the data is stored to the final storage media (HDD/SSD/NVMe), as in step 5 (S5). Once the data associated with a write request is placed on final media, the request and data is deleted out of the smart NVRAM module's RAM 12. Alternatively, the smart NVRAM module may retain the data until it is overwritten or pushed out of memory by additional incoming data.

The application server can then update the data that has been placed in its final media in step 5, or can request additional processing, or can update the storage settings requiring transfer to a different media. That is, the data would be processed again in steps 2 to 5 (or S2 to S5).

Figure 3:
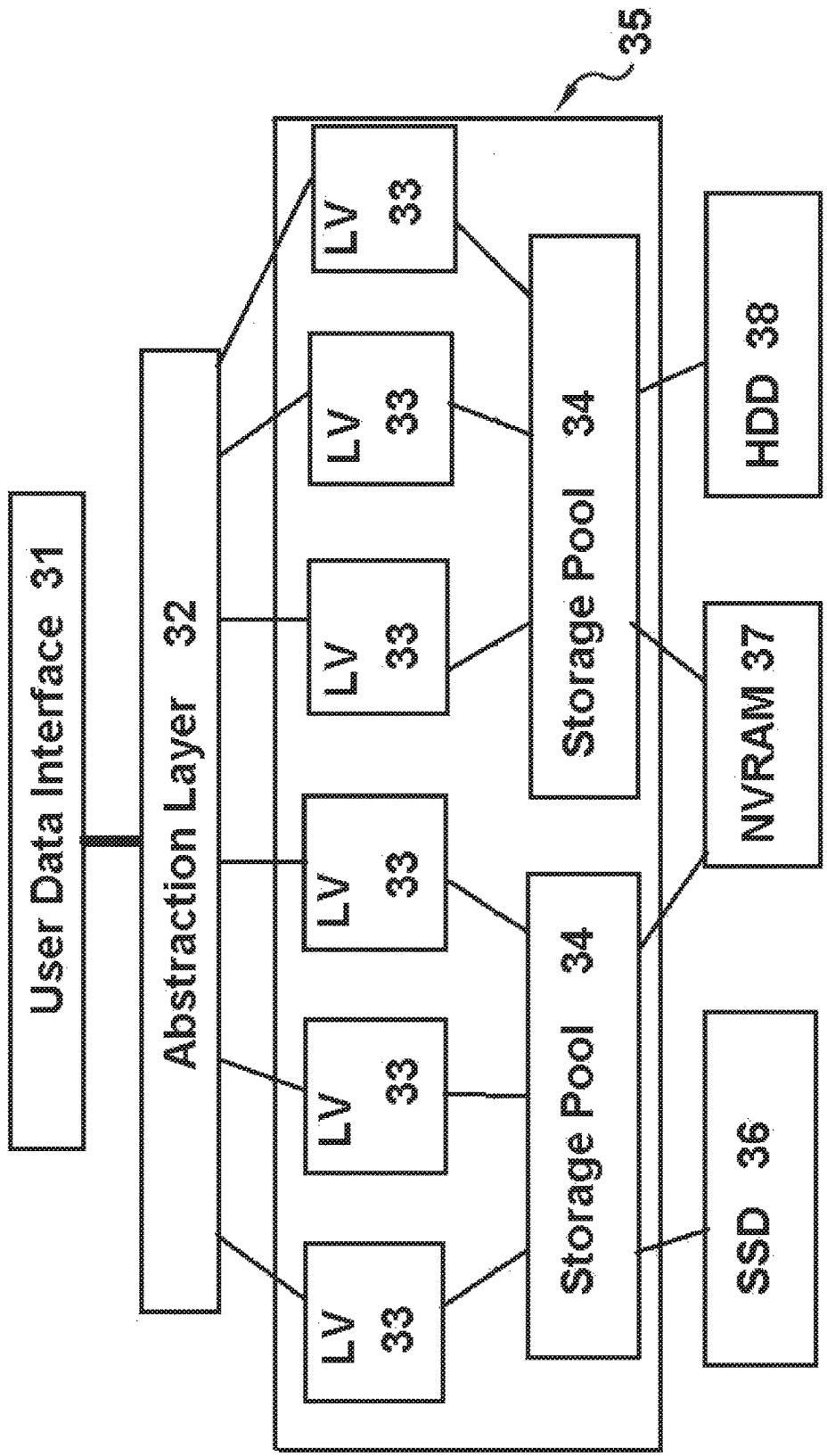
FIG. 3 shows the various layers that data traverses between the user interface and the hardware storage.

The software abstraction layers that make the first three steps of FIG. 2 possible are shown in FIG. 3. The user interface 31 provides a graphical user interface (GUI) or command line to upload data, generate data, import data, or direct data processing to the fiber optic or GBE hardware interfaces of the storage management system. This user interface 31 can be provided as a remote terminal to a server or as a host application. Preferably, the user interface 31 provides (or requires) a selection of final storage media type. Such a selection can include three tiers: a first persistence tier utilizing primarily RAM 12, a second persistence tier utilizing the NAND flash 13, and a third persistence tier utilizing hard drives on the smart RAM module 10. Alternatively, the selection of the persistence tier can control the final placement of data by the storage processor in final media SSD 36, NVRAM 37, or HDD 38.

The abstraction layer 32 is merely an interface between the host application and the storage processors providing the storage abstraction layer 35. This abstraction layer 32 can be a TCP/IP interface, a PCIe interface, GBE switches and routing, fiber networks, or a combination. Essentially, this layer connects the user facing host application to hardware through a data access protocol (preferably FCP or iSCSI).

Once the data is transferred to the storage processors via the abstraction layer 32, the storage abstraction layer run on the storage processors provides control, virtualization, and transmission capabilities. The transmission of data between storage processors and final storage media is handled by the PCIe fabric 49 and PCIe module 46 shown in FIG. 4 where PCIe connects with each storage processor 41 and the various storage medias (NVRAM 51, NVMe 52, HDDs 53, etc). The PCIe fabric 49 and module 46 are managed by fabric management module 43. Preferably, the transmissions between storage processors and from the abstraction layer 32 to the final medias are arbitrated by the smart NVRAM modules 10. To aid this arbitration, the smart NVRAM modules 10 can control or coordinate with the PCIe fabric management module 43, or may, preferably, run the fabric management module 43 on the ASIC 11.

The PCIe fabric 49 comprises the PCIe hardware and buses connecting storage processors with the final medias and with the smart RAM modules 10. The PCIe module 46 is a part of the ASIC 11 controls which interacts with the fabric management module 43 to coordinate transmission among several smart RAM modules 10; the fabric management module 43 is also a part of the storage processors 41.

The virtualization capability of the storage abstraction layer 35 is provided as logical thin volumes 33 and storage pools 34. The logical volumes 33 abstract away the physical volumes of the SSD 36, NVRAM 37, and HDD 38. The management of the fabric transmissions and arbitration of write/read commands from storage processors by several smart RAM modules 10 frees the storage processors to focus on data processing. The spread load and storage is useful for data protection and redundancy if one of the smart RAM modules 10 should fail.

The logical volumes 33 can be thinly provisioned or logical thin volumes. Thin provisioning creates logical volumes with sizes that overbook the available free space. The logical thin volumes 33 utilizing a thin storage pool 34 that contains unused space reserved for use with an arbitrary number of thin volumes. A thin volume is created as a sparse, dedicated volume and memory is allocated from the thin pool as needed. The thin pool can be expanded dynamically when needed for cost-effective allocation of storage space.

This storage topology requires the storage of metadata which maps the address space according to the logical thin volumes. This allocation metadata is preferably provided on the smart RAM modules 10 to aid in arbitration of read/write commands among the storage processors. The metadata will map the real data placement across the final media and all parity data used for redundancy.

In addition, the smart NVRAM modules 10 must be able to maintain atomicity in read/write operations between the various storage processors. Since the smart NVRAM modules 10 are abstracted together and share data via the PCIe fabric 49 in a distributed manner, writes to the smart NVRAM modules 10 require coordination. Advantageously, the smart NVRAM modules 10 store their own key-value metadata, allocation metadata, and virtualization metadata in RAM 12. Therefore, locations of write request data can be accessed with near RAM latency. The guaranteed atomicity for key-value operations, controlled by the ASIC 11, ensures the correct order of operations with metadata; thus the corresponding data operations of the storage processors 41 are automatically performed in the correct sequence.

As noted above, the storage pools 34 are used with the thin logical volumes and controlled by the storage abstraction layer 35 of the storage processors. In addition, the metadata logging the order and completion of operations performed within a storage pool 34 or logical volume 33 is placed on the smart NVRAM modules 10.

Since the smart NVRAM modules 10 arbitrating the storage pool 34 are distributed and communicate directly with each other, the metadata can be compared, shared, and read by any of the smart NVRAM modules 10 to ensure the atomicity of data for operations within the storage pool 34. The distributed, peer-to-peer communications of the smart NVRAM modules 10 and storage processors provides atomic operations such as test-and-set, fetch-and-add, compare-and-swap, and load-link/store-conditional.

The storage types SSD 36, NVRAM 37, HDD 38 correspond to persistence tiers and are available for separate allocation by the user within each storage pool 34 by the storage processors. That is, each storage pool 34 has at least SSD 36, NVRAM 37, and HDD 38 storage types available within the storage pool 34.

Figure 4:
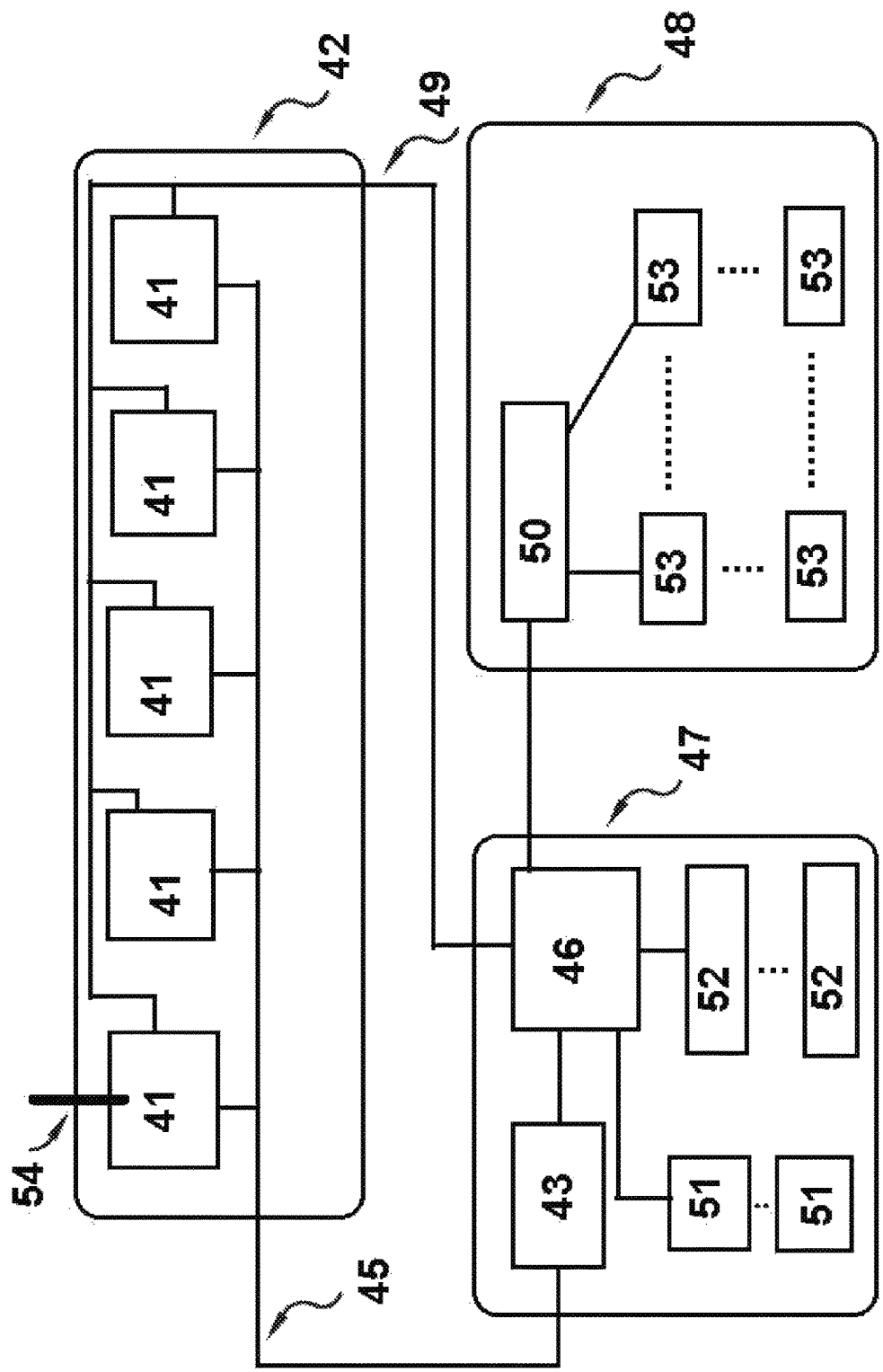
FIG. 4 shows the support architecture for the smart RAM modules.

In FIG. 4 a different high level system view is shown. Some of the elements of FIG. 4 have already been described in the description of FIG. 3. In this diagram, the storage system 42 has processing clusters with storage processors 41 and receives data and instructions from the user interfaces via portal 54. The outside connection or portal 54 can be a fiber channel network running the fiber channel protocol Each of the storage processors has an I/O port connecting to the PCIe fabric 49 and an I/O port connecting to the GBE fabric 45. The PCIe fabric 49 is used for transmitting data throughout the storage system, while the GBE fabric 45 is used to control the PCIe modules 46 and SAS host bus adaptors (HBAs) 50.

As noted above, the storage processors 41 or smart NVRAM modules 10 provide the PCIe fabric management modules 43 which connects to the GBE fabric 45 and provide communication and control from a host application level to the PCIe module 46.

The NVRAM 51, the SSD drives 52 connected via NVMe, the virtual mapping 47 for these memory PCIe drives, the SAS HBAs 50, the SCSI (or SATA) drives 53, and the HDD virtualization 48 are all connected to the storage processors and controlled primarily by them.

In particular, the NVMe preferably complies with the NVMe 1.0 standard which is incorporated herein by reference in its entirety. In addition, various smart NVRAM modules 10 may have NVRAM 12 and HDDs 53, where the HDDs require an internal HBA, while other smart RAM modules 10 may have NVRAM 12 and SSDs 52 which require an internal NVMe module for management of the SSDs. In this way, the smart NVRAM modules 10 provide several persistence tiers and virtualization so that the network of smart NVRAM modules 10 can be a complete storage solution for the storage processors.

Figure 5:
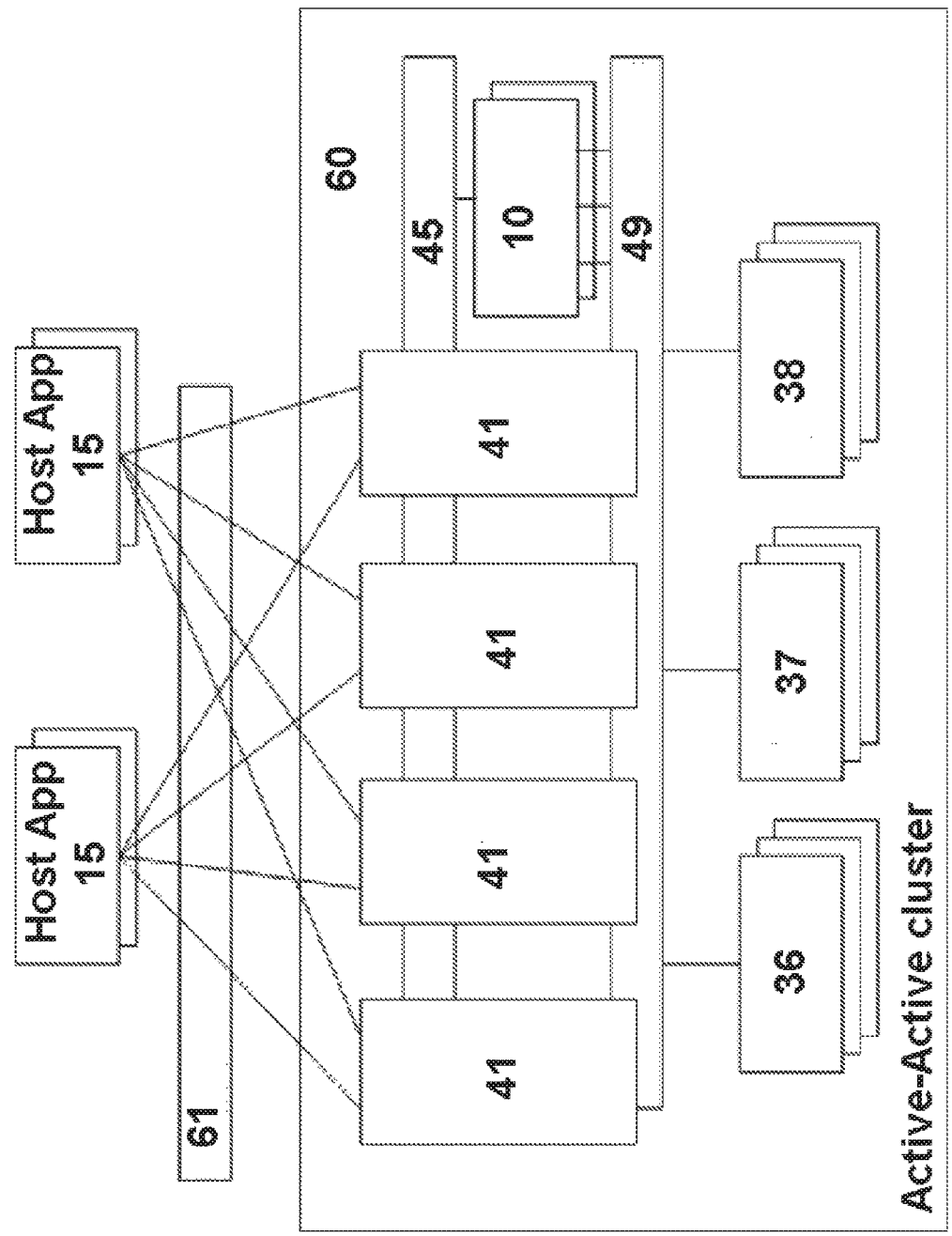
FIG. 5 shows the cluster network and various fabrics.

The relationship between the storage processors 41 and the smart NVRAM modules is better shown in FIG. 5 where the host application 15 connects through a FCP or iSCSI multi-path connection 61 to the storage processors 41. The storage processors 41 are contained within the active-active storage cluster 60. This view shown in FIG. 5 shows the connections tying the hardware together rather than software/hardware layers like those in FIGS. 3 and 4. Here the smart NVRAM modules are provided alongside the storage processors 41 and connected to the GBE network 45 and PCIe fabric 49.

The smart NVRAM modules 10 are visible to all the storage processors 41 in the active-active cluster 60. A primary smart NVRAM module can be backed up by other mirrored smart NVRAM modules. The internal, peer-to-peer communication of the smart NVRAM modules determines which module will take over in event of a failure of the primary module. The NVRAM modules 10 themselves can form an active-passive cluster that functions as active-active towards the storage processors 41. Within the active-active cluster are also the final media NVMe, SSD, HDD or optical media.

The smart NVRAM modules 10 are visible to the storage processors as generic PCIe devices which can be accessed in different ways, e.g. as simple memory-mapped region in the storage processor's CPU address space, or as a block device, or as a custom device on the PCIe bus with a custom data exchange protocol. The smart NVRAM modules 10 can function as write-back cache for the storage processors 41 or as a write-ahead log for them.

The write-back cache model does not require any considerable amount of RAM on the storage processors 41 to cache host application data. However, this model results in heavy traffic on the PCIe bus because the storage processors 41 will try to service all read requests from the NVRAM module. The write-ahead log model requires a significant amount of RAM (at least equal or larger of that on the NVRAM modules) for read caches on the storage processors 41. The upside is that the PCIe bus traffic is much lower, because storage processors 41 use the smart NVRAM modules only to hold/record write requests while they are being processed in the storage system.

When the host application's 15 write request (block address and actual data) arrives at the storage processor 41, the storage processor forwards this write request to the smart NVRAM module 10. The request is stored in RAM 12 and immediately acknowledged to the requesting storage processor 41, which in turn immediately acknowledges the request to the application. The write request from this moment is decoupled from the host application and processed inside the storage system ultimately being placed in the storage media. While the write request is being processed, it is safely kept in the NVRAM module 10. The application read requests can be served through any storage processor 41 since all storage processors 41 have fast access to the NVRAM module 10. This is the write-back cache application of the smart NVRAM 10, which de-conflicts overlapping read/write requests and manages reads of data still being written. This solves the problems noted in the background section.

Alternatively, the write request is stored in RAM of the smart NVRAM module 10, and then the NVRAM module notifies all other storage processors in the cluster about the write request. All other storage processors fetch the write request data from the NVRAM module 10 and put the data into their local RAM read caches. After all the caches of the storage processors 41 are updated, the initiating storage processor 41 (the storage processor that forwarded the write request to the smart NVRAM modules 10) acknowledges the request to the host application 15. The write request from this moment is decoupled from the host application 15 and processed inside the storage system until it is fully placed on the storage media. While the write request is processed, the entire request is kept in the smart NVRAM module. Application read requests can be served through any storage processor as all storage processors have copies of the data in their RAM read caches. This is the write-ahead log (WAL) application of the smart NVRAM modules 10.

As it has been described the NVRAM module 10 serves as a metadata store, this function is supported by CAS enabled key-value store functionality built in into the software running on the embedded ASICs 11. While the storage system moves data from cache tier (NVRAM) down to final media, it must keep track of the association between initial blocks' logical block addresses (those for the host application) and the placed logical block addresses on final medias. This mapping persists in the NVRAM CAS enabled key-value store.

Since the data movement from cache tier (NVRAM) to final medias is performed by all storage processors, the centralized CAS enabled key-value store of the NVRAM module provides the consistency of operations. That is, the NVRAM module 10 provides centralized CAS enabled key-value store which assures consistency of metadata update.

The invention being thus described, it will be obvious that the same may be varied in many ways. For instance, capabilities, components or features from each of the optical arrangements above are combinable or transferrable to any of the other optical arrangements disclosed herein. Such variations are not to be regarded as a departure from the spirit and scope of the invention, and all such modifications as would be obvious to one skilled in the art are intended to be included within the scope of the following claims.

What is claimed is:

1. A data storage module, comprising:
   a bank of dynamic random access memory (DRAM);
   a host interface, including a Peripheral Component Interconnect Express (PCIe) interface;
   an application specific integrated circuit (ASIC) connected to the host interface and the DRAM; and
   a battery, the battery providing power to the DRAM and SSDs in an event of failure of a main power supply,
   wherein the ASIC provides the DRAM as write-back cache via the PCIe interface to storage processors, the storage processors accessing the data module as extensions of local memory address space of the storage processors,
   wherein the power provided by the battery and the main power supply makes the DRAM non-volatile, and
   wherein the ASIC arbitrates write requests received at the storage processors, the storage processors fetching write request data from the DRAM for final placement.

2. The data storage module of claim 1, wherein the ASIC receives write data associated with a write request from a host application, via the PCIe interface and the storage processors, and sequentially hashes the data stream during receipt so that, upon completion of the receipt of the write data, the ASIC can confirm accurate receipt of the write data.

3. The data storage module of claim 2, wherein after receipt of the write data and the write request, the data storage module provides the write data to storage processors until final placement of the write data.

4. The data storage module of claim 1, wherein the ASIC comprises: a cache, a memory controller, a power manager, and a CPU.

5. The data storage module of claim 1, wherein the data storage module is connected to at least two additional data storage modules via a PCIe fabric and a GBE fabric.

6. The data storage module of claim 5, wherein the data storage module and at least two additional data storage modules provide active-active control for the storage processors and arbitrate read and write requests sent to the storage processors by a host application.

7. The data storage module of claim 1, wherein the ASIC executes applications, encrypts data, compiles applications, compresses data, hashes data in real time, and conducts data analysis such as sorting, comparing, merging, and searches as internal processes.

8. A distributed active-active controller for the storage processors, comprising at least two data storage modules according to claim 1, wherein the at least two data storage modules are connected via a PCIe fabric and a GBE fabric,
wherein the active-active controller provides directly accessible cache to central processing units (CPUs) of the storage processors,
wherein the active-active controller receives write requests and corresponding data for temporary placement into DRAM from the storage processors,
wherein the active-active controller arbitrates the write requests in DRAM for all storage processors until final placement into final media of a storage system, and
wherein the active-active controller arbitrates read requests corresponding to data in DRAM to de-conflict read and write requests from a host application.

9. The distributed active-active controller of claim 8, wherein atomicity of operations is maintained by the arbitration of write requests by the active-active controller.

10. The data storage module of claim 1, wherein the DRAM is directly accessible by central processing units (CPUs) of the storage processors.

11. The data storage module of claim 1, further comprising: a NVMe adaptor connecting NAND flash memory to the ASIC.

12. The data storage module of claim 1, wherein the data storage module is portable, swappable, and retains data stored in the DRAM while being swapped or transported.

13. The data storage module of claim 1, wherein all the storage processors fetch the write request data from the DRAM and process the write requests locally, the data storage module storing the write request data until the final placement, any of the storage processors being able to respond to a read request for the write request data.

14. A data storage system, comprising:
a host server, comprising: storage processors, a PCIe fabric, and a GBE fabric;
at least two data storage modules, each comprising:
a bank of dynamic random access memory (DRAM);
NAND flash memory;
a host interface, including a Peripheral Component Interconnect Express (PCIe) interface and a gigabyte Ethernet (GBE) interface;
an application specific integrated circuit (ASIC) connected to the host interface and the DRAM; and
a battery, the battery providing power to the DRAM and NAND flash memory in an event of failure of a main power supply,
wherein write requests and write data forwarded by the host server, via a PCIe connection of the PCIe fabric, from a host application is received at the host interface and placed directly in DRAM as a write-back cache or a write-ahead log, and
wherein the write requests in DRAM are arbitrated between storage processors for processing the write requests by the ASIC.

15. A method for arbitration of write requests between storage processors of a storage system, comprising:
providing a smart non-volatile random access memory (NVRAM) module including a bank of dynamic random access memory (DRAM) and a host interface both connected to an application specific integrated circuit (ASIC), and a battery for powering the DRAM;
upon receiving a write request with write data from a host application at the storage processors, forwarding the write request and the write data to the smart NVRAM module, the smart NVRAM module automatically acknowledging receipt to the storage processors, and the storage processors forwarding the receipt to the host application;
storing the write request and write data in the DRAM of the smart NVRAM module, and notifying the storage processors of an address of the write request and the write data, wherein central processing units (CPUs) of the storage processors can access the DRAM as additional memory address space;
fetching the write request and write data, by a specific storage processor of the storage processors, for final placement in a long-term storage media,
wherein, before final placement, if the storage processors receive a read request for the write data, the smart NVRAM module de-conflicts the read request and the write request and serves the write data up to the host application via the storage processors.

* * * * *

UNITED STATES PATENT AND TRADEMARK OFFICE
CERTIFICATE OF CORRECTION

PATENT NO. : 10,310,995 B1  
APPLICATION NO. : 16/051950  
DATED : June 4, 2019  
INVENTOR(S) : Malygin et al.

Page 1 of 1

It is certified that error appears in the above-identified patent and that said Letters Patent is hereby corrected as shown below:

In the Specification

In Column 2, Lines 36-37, change "or the NVMe protocol, or both" to --, NVMe, or any combination of these protocols--.

In Column 2, Line 38, change "SCSI" to --protocol-specific--.

In Column 2, Line 39, change "gigabyte" to --gigabit--.

In Column 3, Line 9, change "fully" to --full--.

In Column 3, Line 34, change "searches" to --searching--.

In Column 5, Line 22, change "gigabyte" to --gigabit--.

In Column 10, Line 23, change "CAS" to --Compare And Swap (CAS)--.

In the Claims

In Column 12, Line 11, change "gigabyte" to --gigabit--.

Signed and Sealed this  
Twenty-first Day of January, 2020

Andrei Iancu  
*Director of the United States Patent and Trademark Office*